US009025356B2

(12) United States Patent
Lu et al.

(10) Patent No.: US 9,025,356 B2
(45) Date of Patent: May 5, 2015

(54) FLY-OVER CONDUCTOR SEGMENTS IN INTEGRATED CIRCUITS WITH SUCCESSIVE LOAD DEVICES ALONG A SIGNAL PATH

(75) Inventors: Hsiao-Wen Lu, Guishan Township, Taoyuan County (TW); Wei-Jer Hsieh, Hsinchu (TW); Chiting Cheng, Taichung (TW); Chung-Cheng Chou, Hsin-Chu (TW); Jonathan Tsung-Yung Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 306 days.

(21) Appl. No.: 13/221,081

(22) Filed: Aug. 30, 2011

(65) Prior Publication Data
US 2013/0051128 A1    Feb. 28, 2013

(51) Int. Cl.
G11C 5/06 (2006.01)
G11C 7/10 (2006.01)
G11C 11/00 (2006.01)
G11C 11/413 (2006.01)

(52) U.S. Cl.
CPC .............. G11C 5/063 (2013.01); G11C 11/413 (2013.01)

(58) Field of Classification Search
CPC ................ G11C 11/413; G11C 5/063

USPC .......... 365/63, 191, 189.08, 230.06, 154–156
See application file for complete search history.

(56) References Cited

U.S. PATENT DOCUMENTS

| 4,958,326 | A | * | 9/1990 | Sakurai | 365/185.06 |
| 5,881,006 | A | * | 3/1999 | Yabe et al. | 365/207 |
| 7,570,504 | B2 | * | 8/2009 | Vo | 365/63 |
| 7,606,057 | B2 | * | 10/2009 | Wang et al. | 365/63 |
| 2007/0201262 | A1 | * | 8/2007 | Joshi et al. | 365/154 |

FOREIGN PATENT DOCUMENTS

JP        04238191 A   *   8/1992   .......... G11C 11/401

* cited by examiner

*Primary Examiner* — Vanthu Nguyen
*Assistant Examiner* — Khamdan Alrobaie
(74) *Attorney, Agent, or Firm* — Duane Morris LLP

(57) ABSTRACT

The propagation delay of a signal through multiple load devices coupled sequentially along a conductor is improved by separating a subset of the load devices that is more distant from the signal source, and coupling the more distant subset to the signal through a fly-over conductor that bypasses the subset that is nearer to the signal source. The technique is applicable to subsets of bit cells in a random access memory (SRAM) coupled to a given word line, or to word line decoder gates coupled sequentially to a strobe signal, as well as other circuits wherein load devices selectable as a group can be divided into subsets by proximity to the signal source. In an SRAM layout with multiple levels, different metal deposition layers carry the conductor legs between the load devices versus the fly-over conductor bypassing the nearer subset.

18 Claims, 10 Drawing Sheets

FLY-OVER CONDUCTOR SEGMENTS IN INTEGRATED CIRCUITS WITH SUCCESSIVE LOAD DEVICES ALONG A SIGNAL PATH

BACKGROUND

This disclosure concerns improving the propagation speed and pulse shape of digital signals propagating in an integrated circuit laid out such that successive loads are located at incremental distances down a signal line coupled at a near end to a signal source. Such a configuration is exemplified by the addressing and enable signals that address or select bit cells in an integrated circuit memory such as a static random access memory (SRAM). Loads that are more distant down the line from the source are electrically isolated from the nearer loads by a gap provided along the signal line, forming two or more discrete subsets of the loads. The signal line is configured with two or more conductors, one being a fly-over conductor that bypasses the nearer loads and couples the more distant loads to the signal source or to a point more proximal to the source.

Integrated circuits may have a succession of load devices connected commonly to a same signal line. The signal line comprises a conductive path over which a signal propagates from a source, down the line to each load in turn. In a digital device, the signal is typically a square pulse or a rising or falling transition in voltage level representing a changing logic value.

A array of bit cells in an integrated circuit memory, has word lines and bit lines that extend across the span of the array and are coupled to numerous bit cells along the rows and columns that correspond in location. Additionally, address gates for enabling selected rows and columns are located along perimeters of the array. An integrated circuit SRAM is one example. Various other digital devices and configurations also may be characterized by load devices located one after another down the line along the same conductor carrying a signal to the loads. The loads are functionally coupled in parallel with one another but physically are successively located along the signal line, spaced by legs of the signal-carrying conductor running between adjacent load devices.

It is possible in some configurations that one gate output or inverter or line driver or other device functioning as a single signal source may be used directly to drive all of the load device inputs along the conductor. But in other configurations, the loads may be numerous and the signal line long; or the conductor coupling the signal source to the loads may have considerable electrical resistance; or the conductor or the loads may be characterized by considerable capacitance; or it may be desired to operate with a very high frequency and short signal pulse width. Any or all of these conditions can be such that a single line driver or gate output is not sufficient to drive all of the loads.

Applicable load devices may include, for example, actively switched circuit elements such as transistors, inverters, gates, latches, flip-flops and the like. The input signals are typically clocking or switching signals and also level or data signals that need to achieve a predetermined logic level as of some point in time. Insofar as the inputs the devices are semiconductors, capacitance is associated with the gates of CMOS field effect transistors (FETs) or the bases or emitters of bipolar transistors in gates. The maximum operational frequency of circuits containing such load devices may be limited by the delay needed to establish necessary levels and to apply necessary clocking edges, dependably, at the remotest and/or slowest of the switched circuit elements.

A typical six-transistor (6T) bit cell used for CMOS SRAM has two cross-coupled inverters, each comprising a complementary NMOS and PMOS transistor pair. Because the inverters are cross coupled (inputs to outputs), they hold one another in stable logic state until forced to switch, whereupon the inverters hold one another in the other logic state. The bit cell thus stores one bit of information that can be read or written. Access for read or write operations is through two NMOS FET isolation transistors known as passing gates, coupled to the inverter cross coupling nodes on both sides of the cell. The two passing gates respectively connect the cell to a bit line signal BL and a bit line complement signal BLB. (The bit line complement BLB may alternatively be identified as BL-Bar or BLN or BL-not, etc.)

So long as the power remains on the bit cell, the bit cell is stable because the two inverters hold one another in their present state. The isolation transistors allow the bit cell to float when its word line is not asserted, and protect the value stored in the cell during pre-charging of the bit line signals. The values of the bit line signals BL and BLB determine whether the cell is to be read or written. After precharging of the bit line signals, a pulse on the word line control signal WL switches the passing gate transistors into a conductive state, thus accessing the cell for reading or writing according to the bit line values. External tri-state drivers are used to determine the bit cell value when reading, and when writing to the bit cell, to force the inverters to change state as necessary.

An SRAM is typically constructed in a regular row-and-column grid layout of one bit memory cells. An individual bit cell is addressed by applying a word line (WL) signal to address and enable all the bit cells along a given line, and then applying a combination of values to two complementary bit lines (BL and BLB) to read from or to write to the cells that correspond to the bit positions in the word. When the word line signal for a particular bit cell is not selected, the cells on that word line are isolated.

In a typical configuration associated with addressing the bit cells of an SRAM, inputs that define a binary number word line address are decoded to one word line, enabled at the input of a gate for that word line, and the other input of the gate is coupled to a clocking pulse. The output of the gate can be coupled to an inverter that functions as a line driver to apply the clocking pulse to the loads on the addressed word line, namely the gates of the passing gate transistors for all the bit cells on the word line. A situation may occur in which the word line is sufficiently long that the slew rate on the rising and falling edges of the pulse at the farthest bit cell is poor. Or the pulse may not achieve a full swing between respective logic states at the farthest bit. A conventional solution to this problem is to insert a repeater along the signal path to improve the signal slew for the distant elements. The repeater comprises two inverters in cascade (two being necessary to maintain the high-true or low-true logic sense of the signal). The repeater drives the signal to the more distant elements, but each inverter adds an additional propagation delay. Each inverter occupies valuable circuit area.

For purposes of illustration and without limitation, the handling of signals applied to loads as described is exemplified in this disclosure by static random access memory (SRAM) bit cells, their line addressing gates and bit cell line drivers. A memory array on an integrated circuit may have tens of thousands of bit cells disposed typically in a regular X-Y grid arrangement in which word lines and bit lines respectively address rows and columns. The intersection of a word line (WL) selected by a pulsed signal, and bit lines (BL and BLB) selected by logic levels, causes writing or reading to or from the bit cell.

An SRAM arrangement could comprise, for example, 128 word line rows, each row having 256 bit lines. Each of the 128 word line signals may be selected by a word line enable gate, all the word line enable gates being loads along a signal path. Likewise, the word lines are coupled to the gate terminals of two NMOS FETs that function as passing gates to couple the bit lines (BL and BLB) to the normally-floating cross-coupled inverters of bit cells when the associated word line signal is asserted, in this example totaling 512 NMOS FET transistors successively coupled along the word line signal path.

The loads as described that are placed along the signal lines each contribute a capacitance. Each leg of the signal conductor extending between the successive loads inserts a resistance. Each iteration of a series resistance and parallel capacitance along the signal path functions as a low pass filter, from the load device closest to the signal source out to the load device farthest from the signal source. As a result, each load sees a progressively more filtered version of the word line signal. If the original signal is a pulse with square edges between levels equal to the power supply voltages, the rise and fall times of the pulse and the full swing between logic level voltages deteriorate from each load to the next. The time at which the edges of the pulse cross the threshold voltage of the NMOS FETs becomes later at each successive load and the amplitude of the swing is attenuated.

It is known when driving a long signal line characterized by attenuation to boost the amplitude of the signal by inserting repeaters at spaced locations, i.e., line driving amplifiers. In a digital embodiment, the line driver can comprise a digital inverter, or more typically, two cascaded inverters so that the same logic level polarity is maintained. The output of such a line driver is squared up. The output has a short rise time. The output swings between the high and low power supply voltages. However, the line driver inserts a propagation delay even in addition to the propagation delay resulting from the serial resistance of the signal conductor and the capacitance of the loads. Furthermore, space in the integrated circuit is needed for two cascaded inverters forming a line driver (at least four MOS transistors) and such space would be required for each of the lines that requires a line driver. It would be advantageous is a solution could be provided that uses less circuit area, is less complicated and does not introduce unnecessary propagation delay.

Propagation delay and signal attenuation associated with the resistance of conductors carrying a signal from one load device to the next, are increasingly important issues as the scale of integrated circuits is made smaller and smaller. The new 28 nm integrated circuit technology processes of Taiwan Semiconductor Manufacturing Corp. (TSMC), for example, delivers twice the gate density of a 40 nm process, and has a 50 percent smaller SRAM bit cell size. But if the conductors used to carry signals are narrower and thinner than in previous technologies, the resistance per unit length is increased (in this case substantially doubled). If the SRAM cells are smaller, they are also more densely positioned. In small scaled high density configurations, the combined serial resistance of conductor legs between loads and the characteristic FET gate capacitance of the SRAM transistors produces propagation delay and signal attenuation that remains an issue even though the nominal length of a conductor needed to serve a given number of successive loads is scaled down.

It would be advantageous to provide a circuit and technique that enables driving a long line of load devices from a signal conductor or a densely loaded signal conductor generally with closer spaced loads between conductor legs of greater resistance, while minimizing propagation delay and its associated challenges.

SUMMARY

It is an object of the disclosed embodiments to facilitate operation of digital devices that may have a fan-out of multiple loads coupled along a signal conductor to a signal source such as a gate, inverter or line driver. In integrated circuits, a long and numerous succession of loads may be coupled along a signal conductor, each load having a certain characteristic capacitance and each connecting conductor leg having a serial resistance. One aspect of this disclosure is to provide configurations that provide adequate voltage swing and high slew rate at the load devices that are distant along the conductor from the signal source. Another aspect is to achieve that result without unnecessarily adding to propagation delay by use of added line drivers.

The loads and the signal conductors may be scaled down to a small size and densely packed, thus shortening the length of the conductors but due to smaller dimensions increasing the conductor resistance. Another object is to configure connections as described for a scaled down integrated circuit process. This is achieved in part by adding additional conductors that are located alongside and are seemingly redundant with other conductors, but the additional conductors bypass the loads located nearer to the signal source and their associated capacitance. Additional conductive lines associated with existing lines consume only limited circuit space, making this solution apt for scaled down layouts and production processes.

In order to reduce propagation time and to improve pulse rise times, particularly at the more-distant loads, a conductor as described is subdivided into plural serial sections. A driver applies the signal to the nearest section. One or more sections that are more distant are separately driven using drivers that are coupled to the source along conductors that bypass (or fly over) the nearer section(s).

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is a schematic illustration of a signal line in an integrated circuit with successive load devices along a signal path, in this example the load devices being SRAM bit cells and the signal path being a word line carrying a pulse that enables the bit cells when active.

DETAILED DESCRIPTION

Figure 1:
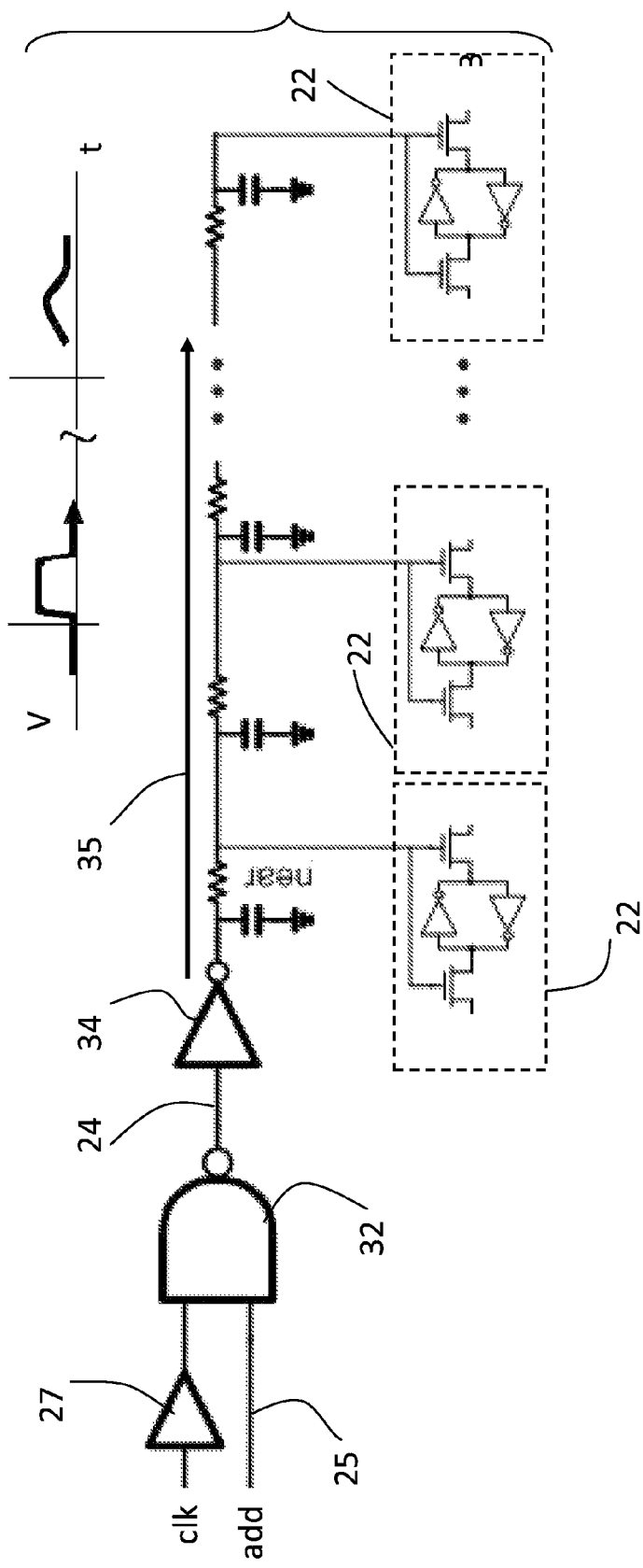

In FIG. 1, a signal line in an integrated circuit or the like is coupled to a plurality of load devices 22 disposed successively along a signal path. In this example the load devices 22 are shown as bit cells typical of a static random access memory. The signal path in this example corresponds to a word line by which all the bit cells along the signal path are enabled so that the bit cells can be accessed substantially simultaneously over bit lines coupled to each bit cell.

In the configuration shown, a pulse is produced at a signal source line 24, when the line is addressed by an associated gate input 25 and clock or strobe pulse from a driver 27 at the input to NAND gate 32. The output of gate 32 is coupled to an inverter 34 that drives the signal conduct coupled by successive conductor legs to the word line inputs of the load devices 22.

At each load device, the word line signal is coupled to the gates of NMOS passing gate field effect transistors (FETs) and the transistor gate has a certain capacitance. Likewise the conductor has an associated parasitic capacitance due to proximity with other conductors. The leg of the conductor carrying the signal from its connection to one load 22 after another, has a characteristic serial resistance. In very large scale integration with densely placed elements and conductors scaled down to minimum width and thickness, the capacitance and resistance are not trivial. For each load 22 in turn, the circuit has a characteristic capacitance and a serial resistance, shown in FIG. 1 by small series resistor and a parallel capacitor symbols. Each combination of a serial resistor and parallel capacitor functions to some extent as an integrating or low-pass filter element.

A signal that originates at any of the gate elements 27, 32 or driver 34 typically has short rise and fall times, and is substantially a square pulse as shown at the left of the voltage-time plot in FIG. 1. As the signal propagates along the signal path from one successive load to the next along conductor legs having a serial resistance and through distributed parallel capacitance, namely along a signal path 35 in FIG. 1, the characteristics of the pulse signal deteriorate as shown on the right side of the voltage-time plot in FIG. 1. The extent of deterioration is one factor that determines the number of bit cells (loads 22) that can be driven along one signal path.

With increasing rise time, the pulse that was originally square edged at the output of the line driver inverter 34 takes longer to reach the switching threshold voltage of the word line passing gate transistors in the SRAM bit cells. As a result, the bit cells that are more distant from the signal source (such as line 24 at the output of gate 32) take a longer time to respond to the assertion of the word line pulse. At some length, attenuation of the word line pulse also reduces the amplitude of its swing between logic levels. It is highly desirable to operate the process of applying bit lines signals and word line signals in an SRAM so as to achieve the shortest possible memory access time, which enables memory operation at its highest possible frequency.

In a typical SRAM, 128 bit cells (loads 22) per line may be coupled along signal path 35 in a discrete array or block of bit cells, and potentially, one array is coupled to another so that the number of loads 22 along the signal path 35 is multiplied. For example with two arrays coupled along the same word line signal paths, 256 bit cells may be coupled along the signal path, all driven from the same signal source. One way to deal with the deterioration in the word line pulse signal is to insert a repeater amplifier, such as two cascaded inverters operating as an additional line driver along the signal path. A convenient location for such drivers is where the word line signal path is coupled from one SRAM bit cell array (e.g., a 128 by 128 array) to the next similar array. This arrangement is shown in FIG. 2, labeled "prior art.". 1, wherein a repeater comprising two cascaded inverters 44 is disposed along a signal path as in FIG. 1.

Figure 2:
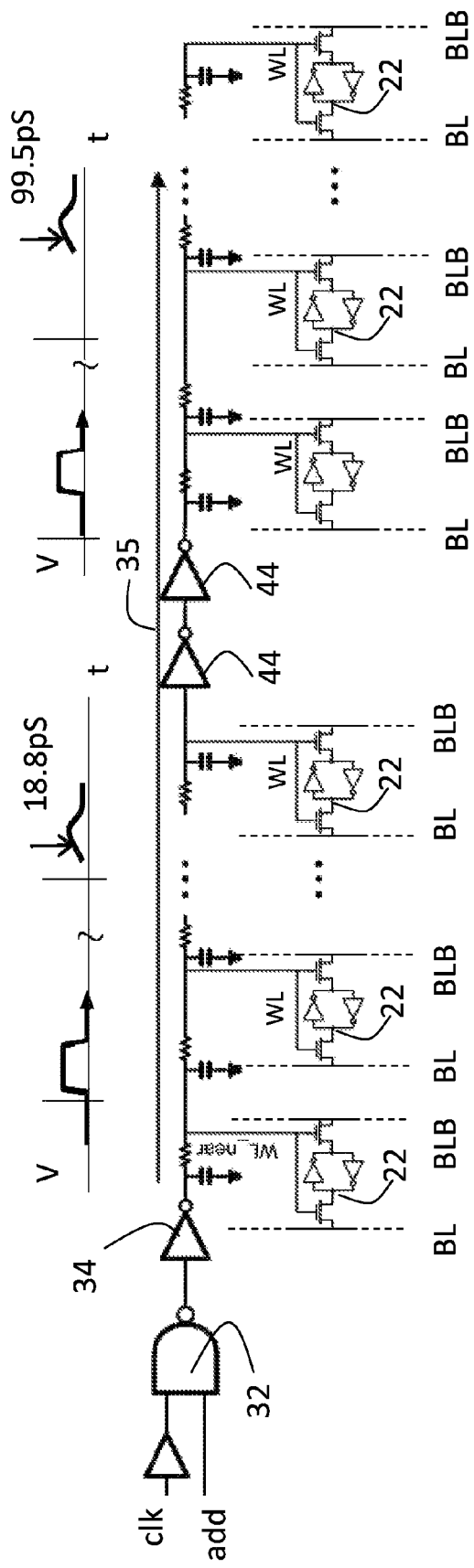
FIG. 2 is a schematic illustration corresponding to FIG. 1, wherein a repeater is disposed along a signal path as in FIG. 1.
Figure 3:
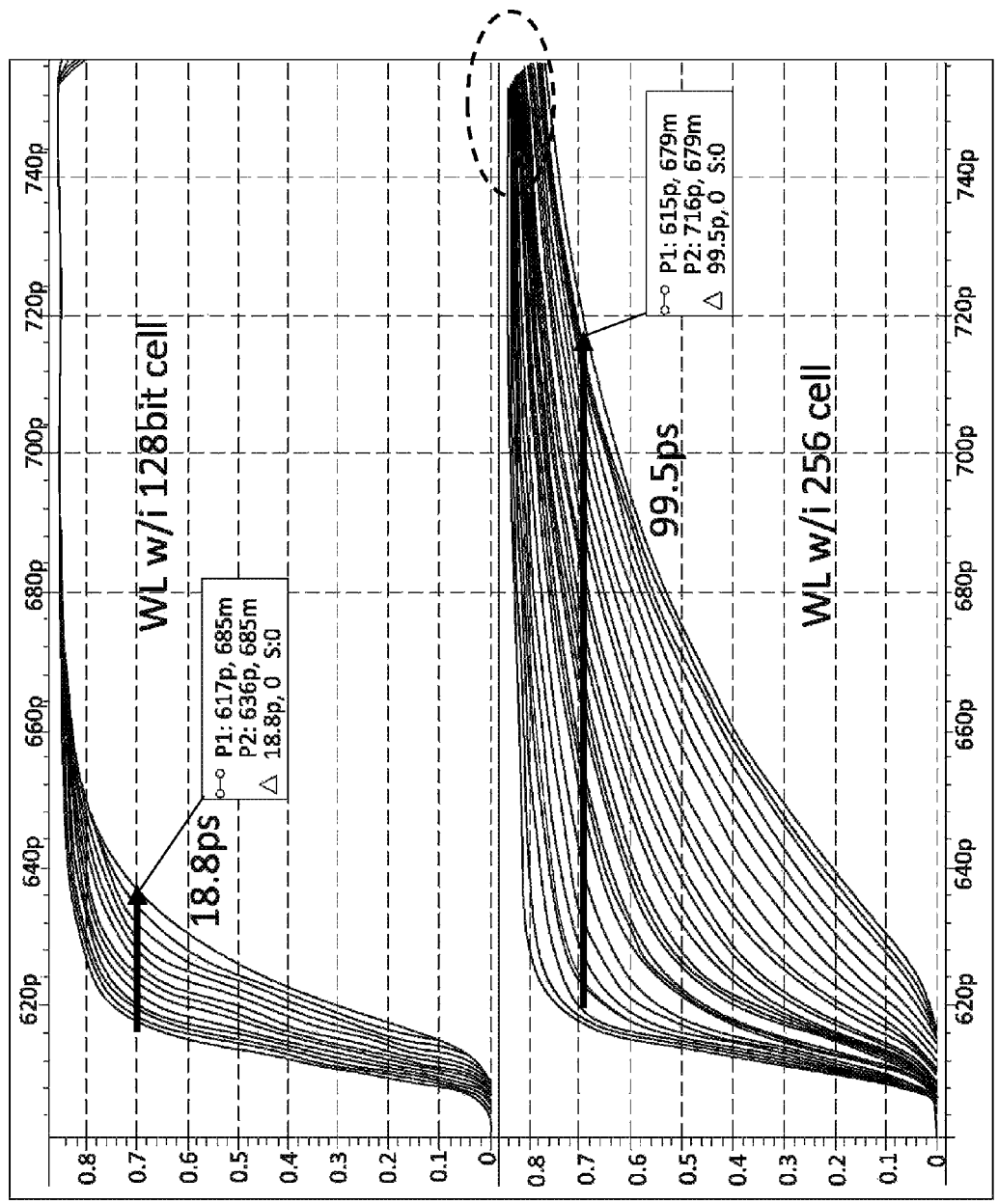
FIG. 3 is a dual time diagram plotting voltage versus time for the word line signals at the respective bit cells shown in FIGS. 1 and 2.

FIG. 3 is a dual time diagram plotting voltage versus time for the word line signals at the respective bit cells shown in FIGS. 1 and 2. The upper portion of FIG. 3 shows the rising edges of the word line pulse (the output of inverter 34) as seen at the word line inputs of the respective bit cells from the first in along the signal path to number 128, illustrating a propagation delay in this example of 18.8 pS. The bottom portion of FIG. 3 shows the results if one similarly plots the deterioration of rise times on the right side array in FIG. 2. The repeater comprising the two inverters 44 squares up the word line pulse where the signal path couples to the second array, but the signal is squared after the signal has propagated through the first 128 bit cell signal path. The squared up pulse carries that propagation delay. Further, the two inverters 44 each insert a propagation delay that might be on the order of 30 pS each. The second 128 bit cell signal path adds an 18.8 pS delay as well. Therefore, the distribution of rise times from the signal source at the output of inverter 34 to the 256 bit cell, is characterized by a propagation delay of up to 99.5 pS. This delay is one of the factors that determines the maximum frequency at which the SRAM can be operated.

Figure 4:
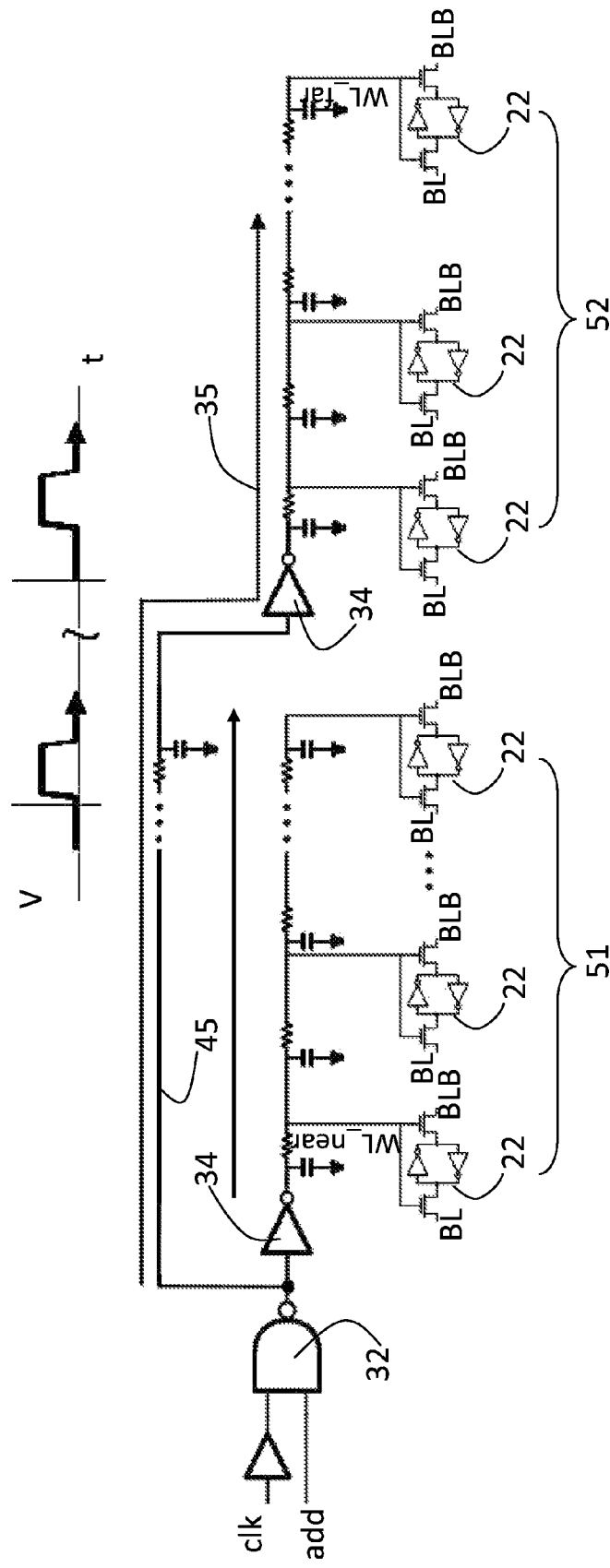
FIG. 4 is a schematic illustration of an embodiment having a fly-over conductor segment according to the present disclosure, wherein at least one subset of the load devices located more distant from a signal source compared to a nearer subset, is coupled to the signal source along a fly-over path that bypasses the nearer subset.

FIG. 4 is a schematic illustration of an embodiment according to an aspect of the present disclosure wherein a fly-over conductor segment 45 is arranged to bypass a subset 51 of the load devices 22 located near to the signal source, in this case the input to inverter 34. All the load devices 22 in the row are coupled to the signal source, but at least one subset 51 that is nearer to the signal source is coupled directly, whereas another subset 52 that is farther from the signal source is coupled along the fly-over path 45 via a conductor that bypasses the nearer subset.

According to the embodiment of FIG. 4, the signal coupled to the more distant subset 52 of loads 22 over the fly-over path 45 is not subjected to the propagation delay of the serial resistances and parallel capacitances inherent in the subset 51 of loads 22. There is some serial resistance and parallel parasitic capacitance along the fly-over path, but (assuming similar conductor material and dimensions) the resistance along the fly-over path 45 is no greater than the sum of resistances of the legs of the conductor leg coupling loads 22 of subset 51, and the capacitance is much less. Therefore, this arrangement reduces the propagation delay of the signal out to the most distant load 22 in the farther subset 52.

In FIG. 4, the electrical apparatus shown is one line of bit cells (loads 22) that are all selectively addressed using the same word line select signal at the output of gate 32. However, the technique is applicable to other situations in which an electrical apparatus comprises a source of a digital signal such as the output of a logic gate 32 or another source, and a plurality of loads 22 conductively coupled to the source of the digital signal, the loads being placed successively along at least one conductive path 35. The plurality of loads 22 is subdivided into at least two subsets 51, 52 of loads 22. The subsets are electrically isolated from one another, namely by breaking the connection between the last load 22 in the subset 51 nearer to the source, and the first load 22 in the subset 52 located farther from the source. This amounts to removing a leg of the conductor along a line of loads 22 to subdivide the loads into the subsets. Otherwise, the loads within each of the subsets 51, 52 are connected sequentially by legs of the conductors along the conductive paths.

At least one of plural subsets is located nearer to the source and is bypassed by at least one other of the subsets located farther from the source, along the at least one conductive path. In the embodiment shown, there are two subsets. It is possible to have two subsets or more than two subsets, with at least one and optionally more than one conductive path including at least one fly-over conductor bypassing at least one of the subsets located nearer to the source from a common point located nearer to the source, to couple said other of the subsets located farther from the source to the digital signals. Thus, a third subset (not shown) or more could be disposed along the signal path and likewise isolated while being coupled by a bypass conductor to a point nearer to the signal source, flying over one or more of the subsets nearer to the signal source.

In FIG. 4, the signal source at the output of gate 32 feeds each of the subsets of loads 22. If a third subset had been included that common point located nearer to the source could be the coupled to the source at the end of the fly-over conductor 45. It is also possible to provide an intermediate point along a succession of loads as the common point nearer to the source, and at which successive subsets are coupled to the source either directly at the common point for the next successive subset or around an additional fly-over path (not show) that leads to a subset of loads farther along the line.

In this embodiment, the plurality of loads 22 for all the subsets are disposed substantially in a line proceeding away from the common point at the output of gate 32. This arrangement is advantageous in a regular array of loads 22, such as an SRAM array, particularly because word line and bit line conductors are typically arranged to cross one another in a compact grid layout of the bit cells. Although it might be conceivable to have a fan-out arrangement in which two or more conductors form signal paths 35 that radiate from the common point or are otherwise arranged, such a configuration is likely to be less practical or require more circuit area than a grid-like array. Furthermore, in a grid-like array, the fly-over conductor(s) 45 can be placed closely adjacent to the line of loads in the nearer subset 51 that is bypassed by fly-over conductor 45.

Figure 5:
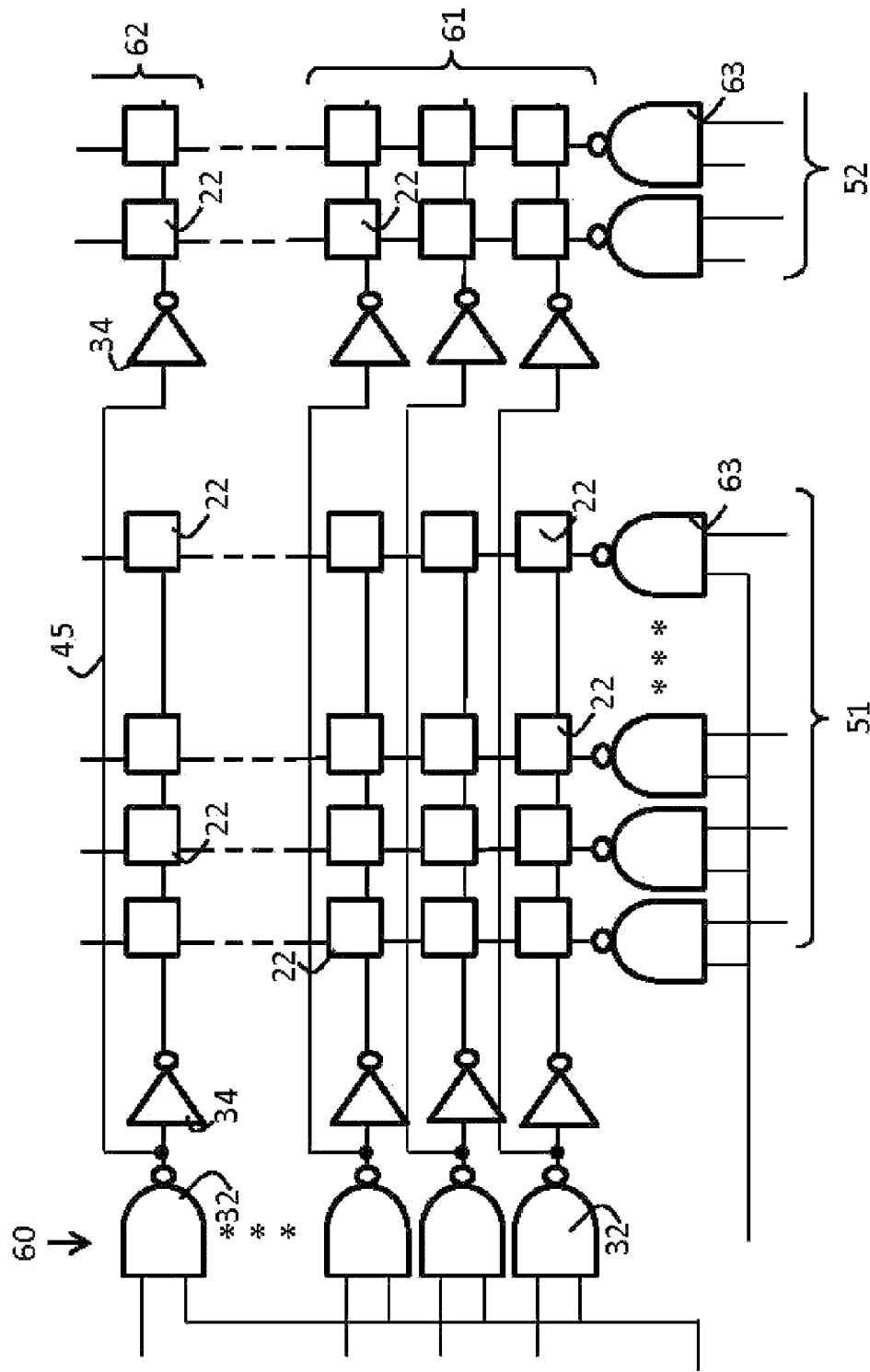
FIG. 5 is a generalized diagram of an embodiment having fly-over paths associated with addressed load elements, wherein an additional fly-over path is associated with line addressing gating, the gating corresponding to devices along the path of an enable signal.

The disclosed arrangements are generally applicable to loads 22 that are disposed such that plural loads are coupled in sequence along a conductor that is continuous and integral as in FIG. 4, and the legs of the conductor along a signal path are merely successive lengths of the integral conductor between points at which the loads 22 are coupled to the conductor. In FIG. 5, a two dimensional array of loads 22 is shown, wherein each of the lines of loads 22 along one axis corresponding to the horizontal rows in the array, is subdivided into at least two subsets 51, 52, wherein the subset 51 that is closer to the respective signal sources comprising gates 60 (shown generally as NAND gate per row) is coupled more directly to the signal source through an inverter 34. The subset 52 that is farther from the signal source is coupled, via a fly-over conductor 45 to the signal source. The plurality of loads in FIG. 5 are disposed substantially along a line forming one of a row and a column of a multi-dimensional array, i.e., the nearer and farther subsets are laterally adjacent, one being nearer and the other being farther from the signal source along horizontal lines. The fly-over conductor 45 comprises a conductor adjacent to the line proceeding away from the common point. Note that the loads are also subdivided as shown into subsets 61, 62 in a vertical direction, one such subset being closer and the other farther from signals originating at gates 63. These subsets may be configurable with flyover bypass conductors in an appropriate embodiment (not shown in FIG. 5).

In this embodiment, each of the subsets 51, 52 of loads 22 has an individual inverter 34 driving that subset. It would be possible to provide just one inverter 34, the output of which is the signal source, and to couple both subsets to that signal source by a conductor. The conductor for the more distant subset would similarly bypass of fly-over the loads 22 in the nearer subset.

In the two dimensional array shown in FIG. 5, lines are provided in crossing directions (perpendicularly in this example). As mentioned, it may be possible in this arrangement to provide fly-over bypass conductors for the lines in both crossing directions if the circuit operation will so permit. However, for SRAM bit cells, it is appropriate to use fly-over bypass conductors for the word line connections to all the passing gate NMOS FETs along a word line row. The bit lines (BL and BLB in FIGS. 1, 2, 4) are used in two way signaling and generally are not employed with bypass conductors, at least not in the same configuration as the word lines. However as seen in FIG. 5, the gating used at the two axes of a two dimensional array may be suitable for using fly-over conductors as described. Such an embodiment is described below for SRAM word line decoder gating, with reference to FIG. 8.

Figure 6:
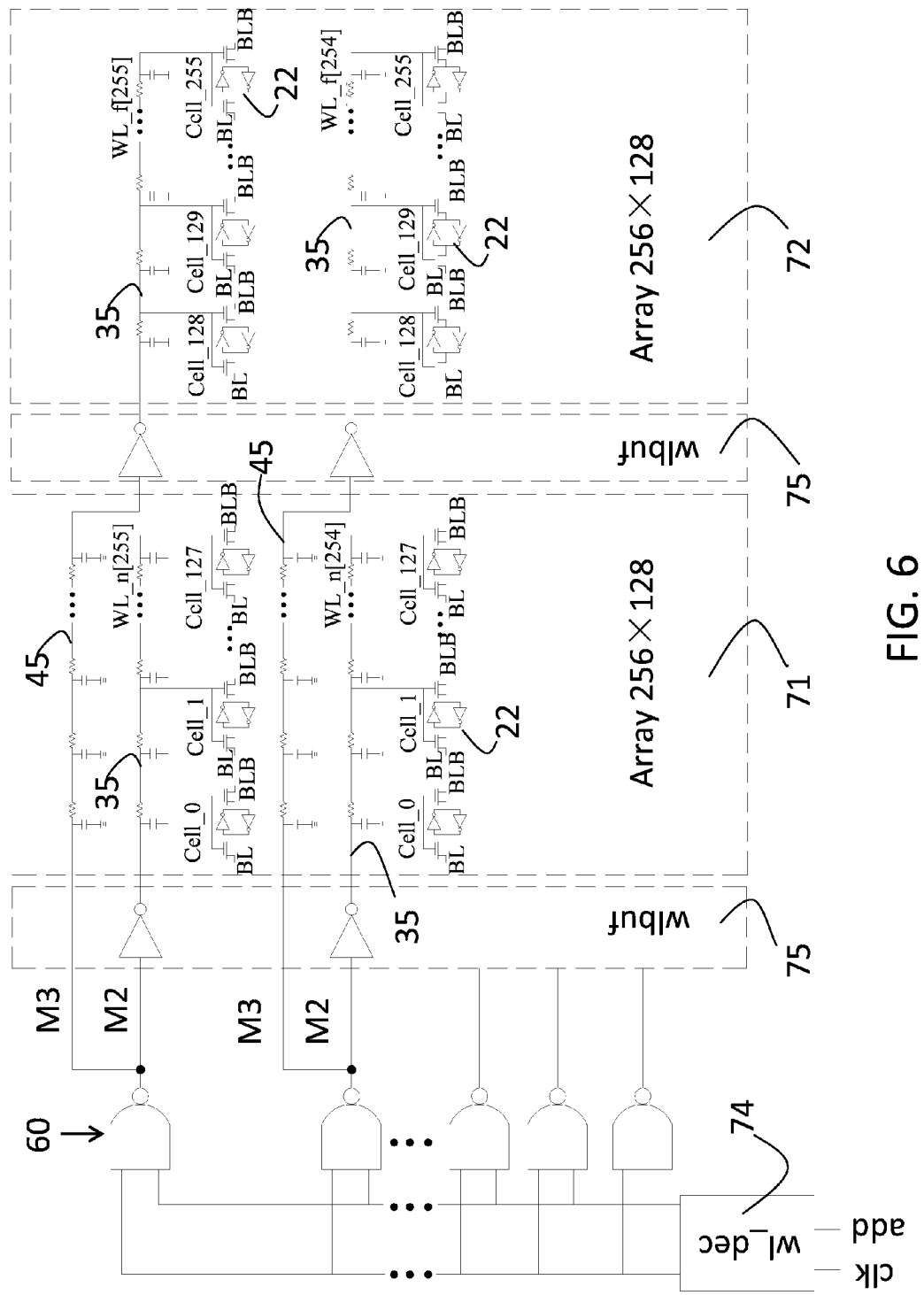
FIG. 6 illustrates an embodiment wherein two SRAM bit cell arrays are provided on an integrated circuit such that word line addressing of one of the arrays is provided on fly-over conductors in a different metallization layer of the integrated circuit layout.

FIG. 6 is a generalized diagram of an embodiment having fly-over paths associated with addressed load elements of a digital memory, in particular an SRAM, wherein an additional fly-over path is associated with word lines. FIG. 6 illustrates an embodiment wherein two SRAM bit cell arrays are provided on an integrated circuit such that word line addressing of one of the arrays is provided on fly-over conductors in a different metallization layer of the integrated circuit layout. In this example, the metallization layer M2 is used for the legs of the conductors that extend between the bit cells associated in both a near subset or array 71 and a far subset or array 72. The fly-over bypass conductor 45, however, is placed on metallization layer M3. This illustration shows that the loads and the conductor can be provided in an integrated circuit laid out in plural levels, and the fly-over conductor 45 comprises a conductive line on a different one of the levels M3 from the level M2 of the legs of the conductor that connect the loads 2 within the respective subsets.

Two distinct SRAM arrays 71, 72 are provided, such as 256 rows by 128 columns each. Only the word line interface gating is shown in this illustration. One of these arrays 71 is nearer to the word line gating 60 and the other array 72 is more distant and at each word line, the word line input of the more distant array 72 is coupled to the common signal input at the output of the word line gates 60 via a fly-over bypass conductor 71. In this embodiment, each array is provided with an inverter or driver 34 in the word line buffer segments 75 of the arrays, coupled to the common point, i.e., the junction of the M2 and M3 layer conductors coupled to the gating 60 and coupled to one another through a via running between the levels (semiconductor layout layers). It is of course also possible to provide the fly-over bypass conductor on the same level as the load-to-load conductor legs, preferably by locating the fly-over bypass conductor closely adjacent to and oriented parallel to the load-load conductor legs.

Figure 7:
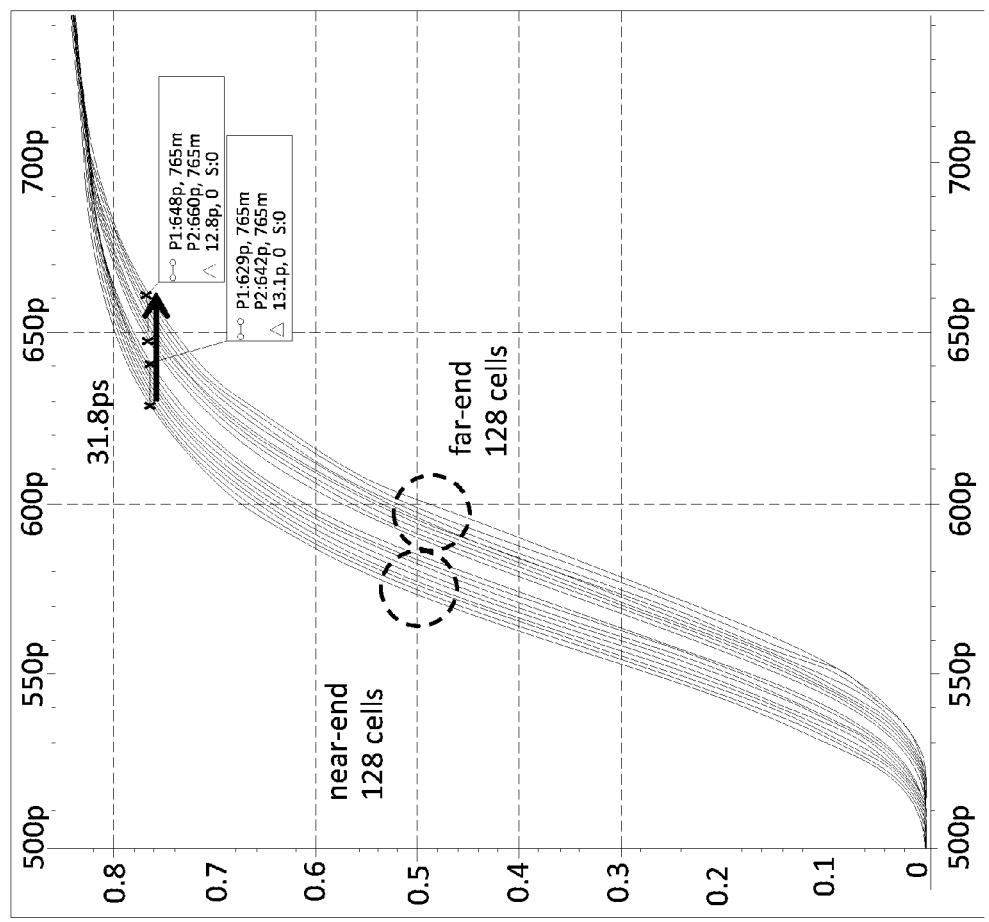
FIG. 7 is a timing diagram showing the distribution of propagation delays for the rising edge of a word line pulse at each of the bit cells in the two 256×128 SRAM bit cell arrays shown in FIG. 6.

The word line decoder 74 and gates 60 are depicted only schematically in FIG. 6. In a practical embodiment, the world line decoder decodes a multi-bit address signal to select one word line address and activates one input to the NAND gate on that line. The clk signal is a strobe input that produces the word line pulse through gate 60 and the inverters 34. As shown in FIG. 7, the timing results of this arrangement are much more favorable than the repeater technique shown in FIG. 2 and shown in the time graph of FIG. 3. In FIG. 7, the respective propagation delays for the near and far arrays of 128 cells each contained a spread of about 13 pS. Due to the propagation delay through the fly-over bypass conductor 45, the entire spread for the array 72 located farther from the word line address gates 60 is slightly delayed. However the total difference from the fastest to the slowest edge crossing is 31.8 pS, or about one third of the spread that is characteristic of the repeater technique.

In one embodiment, the technique of providing fly-over conductor segments with successive load devices along a signal path is applied to static random access memory (SRAM), comprising a plurality of bit cells as the loads 22 arranged in an array, wherein the bit cells in the array are coupled along signal paths for line selection signals, especially for selection of word lines. A set of the bit cells is selectable as a group by activating a line select signal at a signal source associated with one of the signal paths, whereupon individual bit cells along the signal path are made accessible, especially all the bit cells commonly addressed by a distinct word line signal. The signal paths comprise successive legs of conductors, each leg coupling between successive ones of the bit cells in each set that is selectable as the group. The bit cells of each set that is selectable as said group are divided into at least two electrically separated subsets 51, 52 or 71, 72, etc., due to at least one gap in the conductor along the signal paths that lead back to the distinct word line signal by which the subsets are both addressed commonly and substantially simultaneously (but for propagation delays). At least one of the subsets is nearer to the signal source along said signal path compared to at least one other of the subsets that is farther from the source and would see the maximum propagation delay of the other subset, at best, if coupled sequentially to the end of the nearer subset that is farther from the source. However, at least one fly-over conductor coupled to the signal source bypasses the subset that is nearer to the signal source and couples beyond the gap to the nearer end of the farther subset. In this way, the worst case propagation delay to the most distant bit cell from the source of the word line address signal is controlled and the memory can be operated at a higher frequency than would otherwise be possible.

Figure 8:
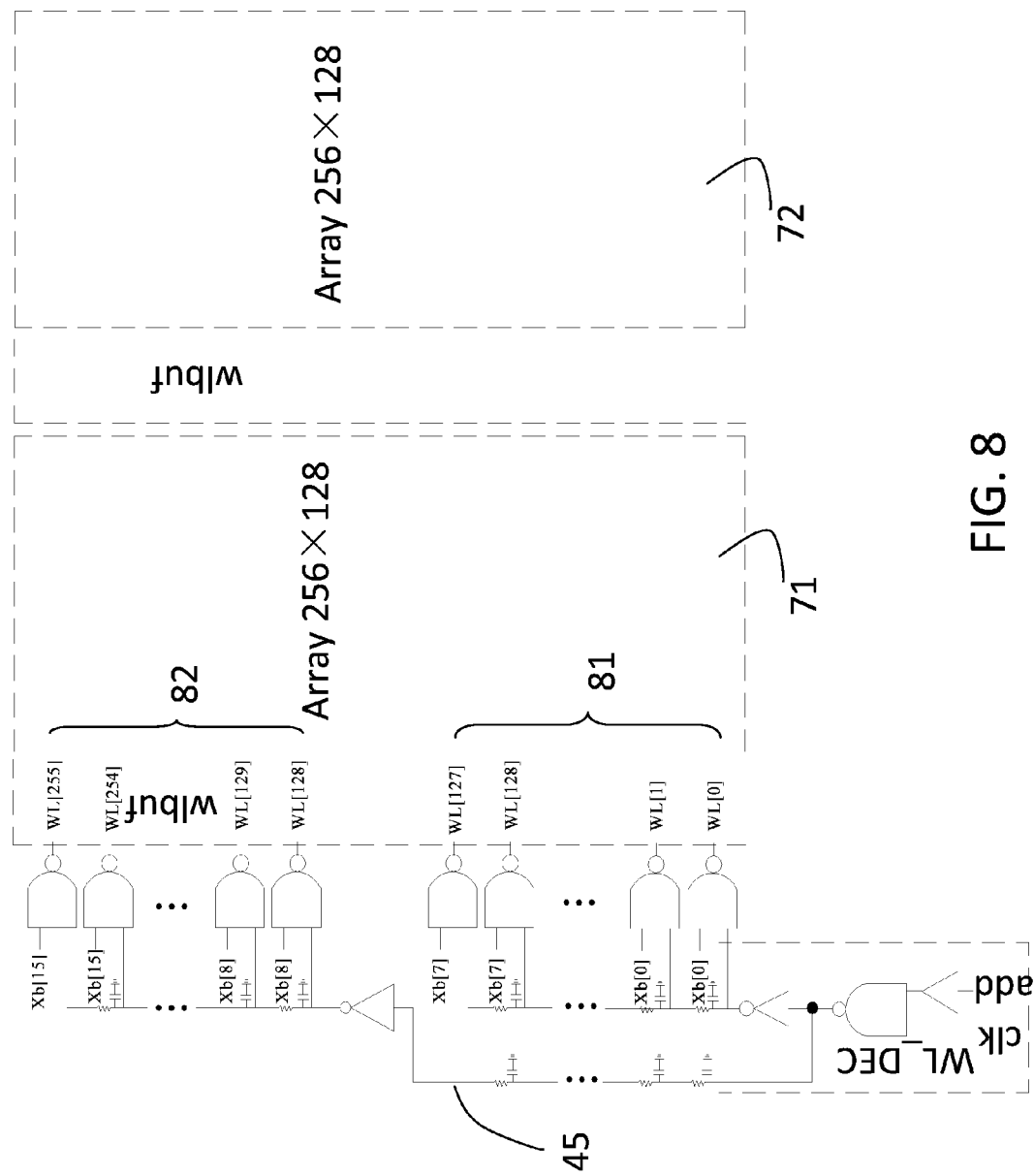
FIG. 8 illustrates an embodiment wherein two SRAM bit cell arrays are addressed using the fly-over addressing technique generally shown in FIG. 5.
Figure 9:
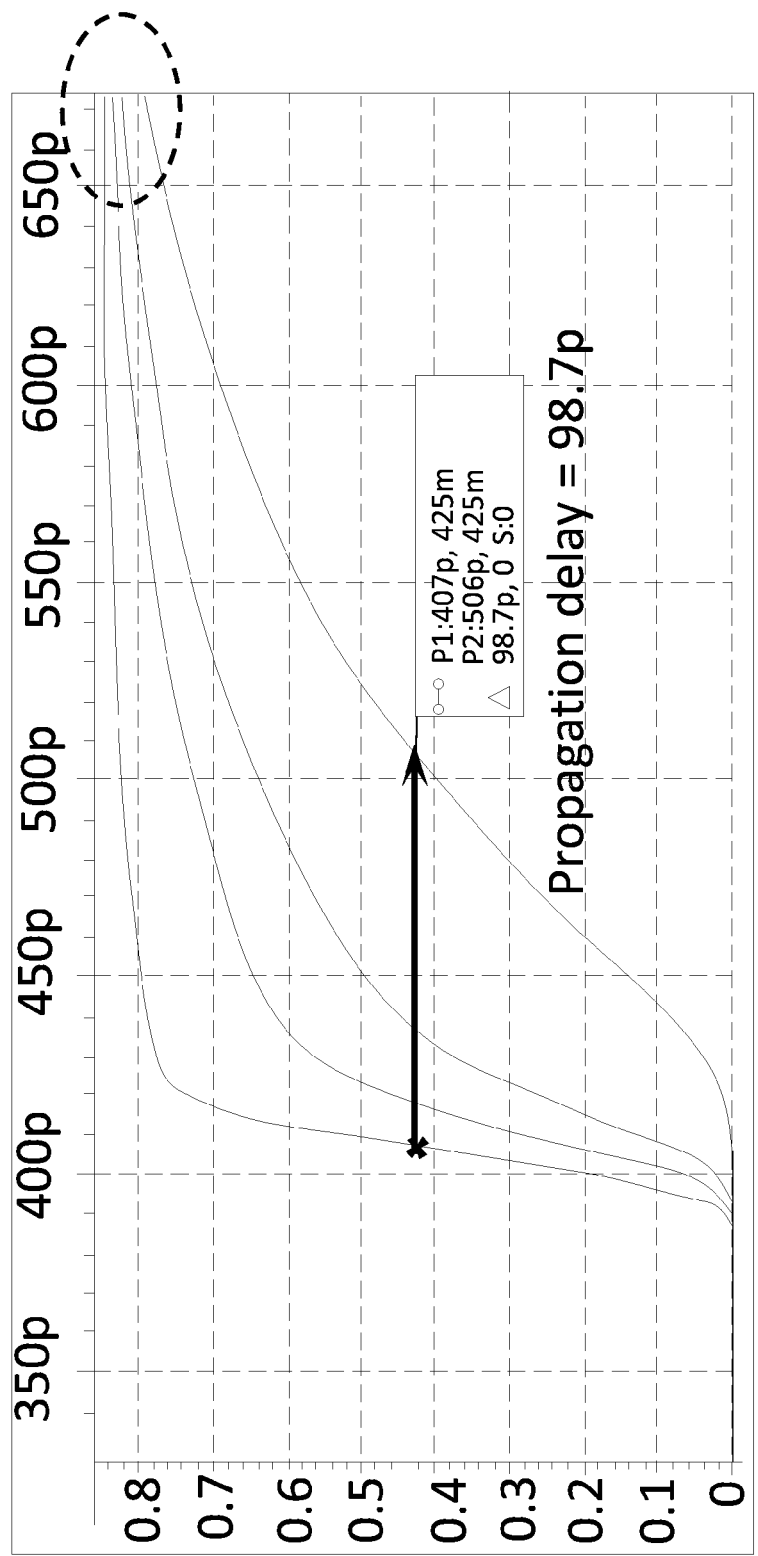
FIG. 9 is a timing diagram showing the distribution of propagation delays of addressing signals applied to a gating configuration as in FIG. 6, with 256 lines enabled along the signal path.
Figure 10:
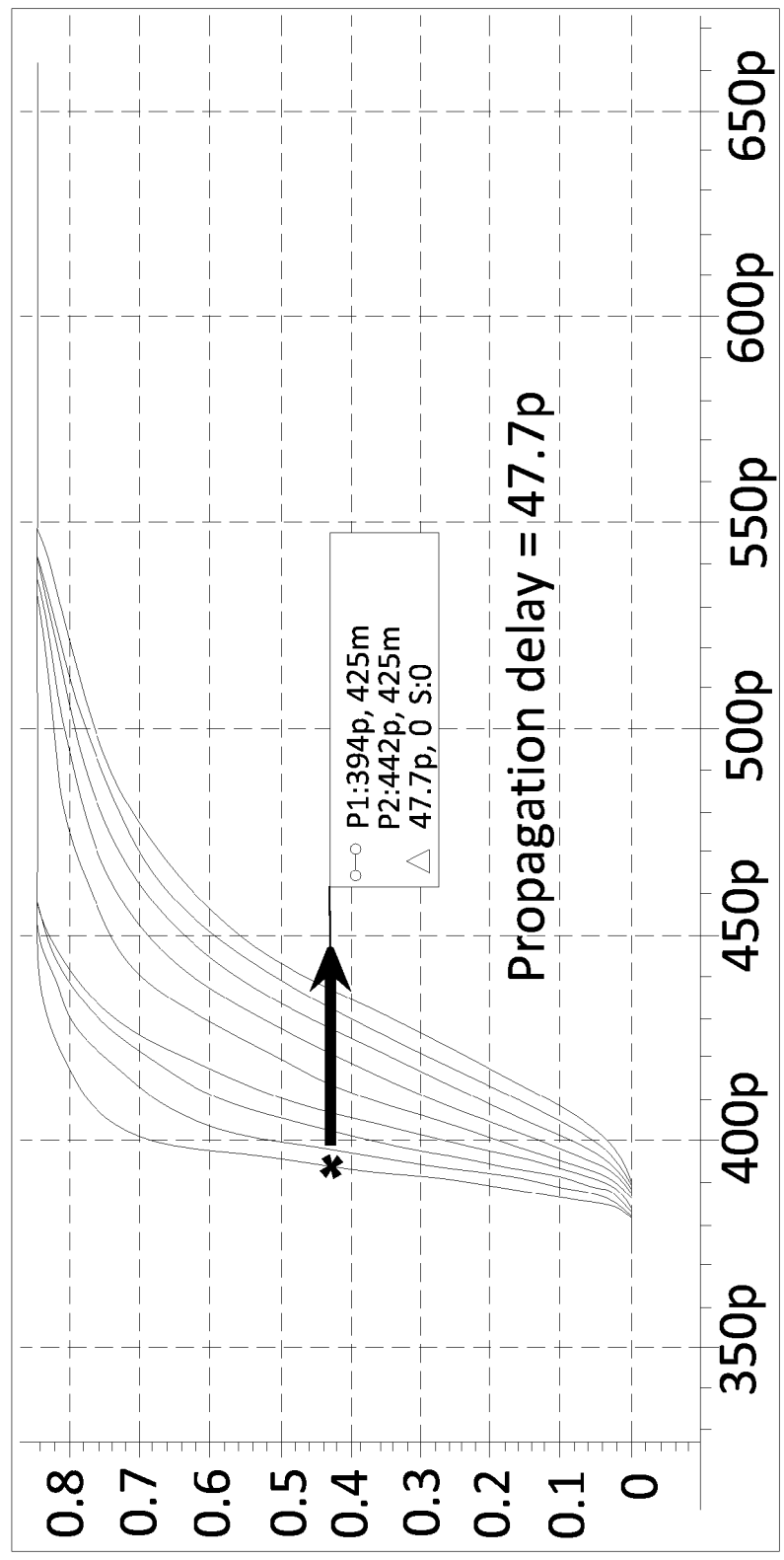
FIG. 10 is a timing diagram showing the distributions of propagation delays of addressing signals in the embodiment shown in FIG. 8.

FIGS. 8-10 illustrate that the technique of employing a fly-over bypass conductor as described can also be applied to the word line address gating 60 by which individual word line signals are generated. The actual gating in FIG. 8 is shown simplified, but for each word line at least one output line address decoding gate is provided along a line of gates 60 and all the gates are strobed by a clk signal that is coupled through conductor legs that coupled sequentially from gate to gate. The propagation delay of the gate signal has all the attributes discussed with respect to the propagation delay of a word line select pulse coupled sequentially from bit cell to bit cell along a word line in an SRAM bit cell array. In this embodiment comprising a plurality of word-line-enable gates, wherein the signal source comprises a gate enable pulse that is coupled by the conductor legs to successive ones of the word-line-enable gates, the word-line-enable gates are subdivided into at least two subsets 81, 82. The subsets are electrically isolated from one another and the word-line-enable gates in gate array 60 within each of the subsets 81, 82 are connected to one another by the legs of the conductor. At least one of the subsets 81 is located nearer to the source along the path, namely the word line decoder block. At least one other of the subsets 82 is located farther from the source along the path. The fly-over conductor 45 bypasses the one such subset 81 located nearer to the source and couples around said one of the subsets from a point located nearer to the source to said other of the subsets 82 located farther from the source. This arrangement likewise produces a savings in propagation delay. FIGS. 9 and 10 are comparable timing diagrams showing the edge rise times using a gate decoder 60 without a fly-over bypass pass and associated inverter (FIG. 9), characterized by a functional propagation delay of 98.7 pS, versus the fly-over bypass connection as shown in FIG. 8, wherein the corresponding timing diagram (FIG. 10) shows a propagation delay of 47.7 pS.

The subject technique can be regarded as a method as well as an apparatus. In one embodiment, a method for reducing propagation delay in a circuit having load devices 22 coupled sequentially along a conductor carrying a signal from a signal source, namely a digital signal having one of a rising and falling edge, included dividing the load devices 22 along the conductor into at least two subsets 51, 52 that are electrically separated by a space in the conductor, one of the subsets 51 being nearer to the signal source along the conductor and another of the subsets 52 being farther from the signal source. The nearer subset 51 is coupled to the signal source at a near end of said nearer subset; and the farther subset is coupled to the signal source at a near end of said farther subset. For further squaring the edge of the signals, albeit with an inherent delay of itself, at least one line driver 34 is provided between the signal source and each of the two or more subsets.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. An apparatus, comprising:
    a word line decoder having at least one output; and
    word line gating circuitry coupled to the at least one output of the word line decoder, the word line gating circuitry including
        a first set of logic gates, and
        a second set of logic gates positioned farther away from the output of the word line decoder than the first set of logic gates,
    wherein a fly-over conductor bypasses the first set of logic gates and couples the second set of logic gates to the first set of logic gates and to the at least one output of the word line decoder at a first common point located between the output of the word line decoder and the first set of logic gates.

2. The apparatus of claim 1, wherein the first set of logic gates and the second set of logic gates are aligned in a single column.

3. The apparatus of claim 1, wherein each of the logic gates of the first set and the second set has a respective output that is coupled to a respective word line.

4. The apparatus of claim 3, wherein each word line is coupled to a respective plurality of bit cells.

5. The apparatus of claim 4, wherein a plurality of bit cells coupled to a first word line is divided into a first set of bit cells and a second set of bits, the first set of bit cells being positioned closer to the output of a first logic gate that is coupled to the first word line than the second set of bit cells.

6. The apparatus of claim 5, wherein each of the bit cells in the second set of bit cells is coupled to the second set of bit cells and to the first logic gate at a second common point located between an output of the first logic gate and the second set of bit cells.

7. The apparatus of claim 6, wherein a second fly-over conductor bypasses the first set of bit cells and couples the first set of bit cells to the second set of bit cells and to the output of the first logic gate at the second common point.

8. The apparatus of claim 1, further comprising
a first inverter having an input coupled to the common point and an output coupled to each of the logic gates in the first set of logic gates; and
a second inverter having an input coupled to the common point and an output coupled to each of the logic gates in the second set of logic gates.

9. A semiconductor memory comprising:
a plurality of word lines each coupled to a respective plurality of bit cells;
a word line decoder having at least one output; and
word line gating circuitry coupled to the at least one output of the word line decoder, the word line gating circuitry including
a first set of logic gates, and
a second set of logic gates positioned farther away from the output of the word line decoder than the first set of logic gates,
wherein a respective output of each of the logic gates in the first set of logic gates and the second set of logic gates is coupled to a respect one of the plurality of word lines, and
wherein a fly-over conductor bypasses the first set of logic gates and couples the second set of logic gates to the first set of logic gates and to the at least one output of the word line decoder at a first common point located between the output of the word line decoder and the first set of logic gates.

10. The semiconductor memory of claim 9, wherein the first set of logic gates and the second set of logic gates are aligned in a single column.

11. The semiconductor memory of claim 9, wherein a plurality of bit cells coupled to a first word line is divided into a first set of bit cells and a second set of bits, the first set of bit cells being positioned closer to the output of a first logic gate that is coupled to the first word line than the second set of bit cells.

12. The semiconductor memory of claim 11, wherein each of the bit cells in the second set of bit cells is coupled to the second set of bit cells and to the first logic gate at a second common point located between an output of the first logic gate and the second set of bit cells.

13. The semiconductor memory of claim 12, wherein a second fly-over conductor bypasses the first set of bit cells and couples the first set of bit cells to the second set of bit cells and to the output of the first logic gate at the second common point.

14. The semiconductor memory of claim 9, further comprising
a first inverter having an input coupled to the first common point and an output coupled to each of the logic gates in the first set of logic gates; and
a second inverter having an input coupled to the first common point and an output coupled to each of the logic gates in the second set of logic gates.

15. A semiconductor memory comprising:
a word line decoder;
a first set of logic gates coupled to an output of the word line decoder; and
a second set of logic gates coupled to the output of the word line decoder;
wherein a first fly-over conductor bypasses the first set of logic gates and couples the second set of logic gates to the first set of logic gates and to the at least one output of the word line decoder at a first common point located between the output of the word line decoder and the first set of logic gates,
wherein at least one logic gate in either the first set of logic gates or the second set of logic gates is coupled to a first set of bit cells and to a second set of bit cells,
wherein a second fly-over conductor bypasses the first set of bit cells and couples the second set of bit cells to an output of the at least one logic gate and to the first set of bit cells at a second common point located between the output of the at least one logic gate and the first set of bit cells.

16. The semiconductor memory of claim 15, further comprising
a first inverter having an input coupled to the first common point and an output coupled to each of the logic gates in the first set of logic gates; and
a second inverter having an input coupled to the first common point and an output coupled to each of the logic gates in the second set of logic gates.

17. The semiconductor memory of claim 16, further comprising:
a third inverter having an input coupled to the output of the at least one logic gate and an output coupled to each of the bit cells in the first set of bit cells; and
a fourth inverter having an input coupled to the second common point and an output coupled to each of the bit cells in the second set of bit cells.

18. The semiconductor memory of claim 15, further comprising:
a first inverter having an input coupled to the output of the at least one logic gate and an output coupled to each of the bit cells in the first set of bit cells; and
a second inverter having an input coupled to the second common point and an output coupled to each of the bit cells in the second set of bit cells.

* * * * *